(12) United States Patent
Hsieh

(10) Patent No.: US 10,234,218 B2
(45) Date of Patent: Mar. 19, 2019

(54) CERAMIC HEAT SINK AND METHOD OF MAKING THE SAME

(71) Applicant: Meng-Hsiu Hsieh, Taichung (TW)

(72) Inventor: Meng-Hsiu Hsieh, Taichung (TW)

( * ) Notice: Subject to any disclaimer, the term of this patent is extended or adjusted under 35 U.S.C. 154(b) by 0 days.

(21) Appl. No.: 15/639,868

(22) Filed: Jun. 30, 2017

(65) Prior Publication Data

US 2019/0003790 A1    Jan. 3, 2019

(51) Int. Cl.
| | |
|---|---|
| *F28F 7/00* | (2006.01) |
| *F28F 21/04* | (2006.01) |
| *B28B 7/36* | (2006.01) |
| *B28B 1/00* | (2006.01) |
| *B28B 17/02* | (2006.01) |
| *B28B 7/42* | (2006.01) |
| *C04B 35/583* | (2006.01) |
| *C04B 35/584* | (2006.01) |
| *H05K 7/20* | (2006.01) |

(52) U.S. Cl.
CPC .............. *F28F 21/04* (2013.01); *B28B 1/008* (2013.01); *B28B 7/36* (2013.01); *B28B 7/42* (2013.01); *B28B 17/026* (2013.01); *C04B 35/583* (2013.01); *C04B 35/584* (2013.01); *H05K 7/2039* (2013.01); *C04B 2235/386* (2013.01); *C04B 2235/3873* (2013.01); *C04B 2235/404* (2013.01); *C04B 2235/602* (2013.01); *F28F 2255/18* (2013.01)

(58) Field of Classification Search
CPC ....... F28F 21/04; F28F 2255/18; B28B 1/008; B28B 7/36; B28B 7/42; B28B 17/026; C04B 35/584; C04B 35/585; C04B 2235/386; C04B 2235/3873; H05K 7/2029
USPC .......................................................... 165/185
See application file for complete search history.

(56) References Cited

U.S. PATENT DOCUMENTS

| | | | | |
|---|---|---|---|---|
| 5,844,310 A | * | 12/1998 | Okikawa | H01L 23/3733 257/712 |
| 5,928,768 A | * | 7/1999 | Ikeda | H01L 23/15 257/E21.53 |
| 6,037,066 A | * | 3/2000 | Kuwabara | B22F 7/008 257/675 |
| 2012/0255719 A1 | | 10/2012 | Hsueh | |
| 2015/0171281 A1 | * | 6/2015 | Nakabayashi | H01L 33/486 257/98 |

* cited by examiner

*Primary Examiner* — Davis Hwu
(74) *Attorney, Agent, or Firm* — Muncy, Geissler, Olds & Lowe, P.C.

(57) ABSTRACT

A method for making a ceramic heat sink is provided. In the first step of the method, a mixed material of nitrite-based ceramic powder, titanium powder and inorganic resin is prepared. The mixed material is then molded into a ceramic blank with a mold coated with titanium. Thereafter, the ceramic blank may be sintered to form the ceramic heat sink. Since the mixture and the mold both contain a common material of titanium, the molded ceramic blank can be easily removed from the mold in its integrity.

9 Claims, 5 Drawing Sheets

CERAMIC HEAT SINK AND METHOD OF MAKING THE SAME

BACKGROUND OF THE INVENTION

1. Field of the Invention

The present invention relates to a heat sink for an electronic device, and more particularly to a ceramic heat sink that has superior heat-dissipation properties and can be produced in high yield.

2. Description of the Related Art

A heat sink is a passive heat exchanger that transfers the heat generated by an electronic device to a fluid medium, often air or a liquid coolant, thereby allowing regulation of the device's temperature at optimal levels. The heat sink is usually made out of copper and/or aluminum and designed to maximize its surface area in contact with the cooling medium surrounding it. Copper is commonly used because it has many desirable properties for thermally efficient and durable heat exchangers. Aluminum is also used in applications where weight is a big concern.

As shown in FIG. 5, a conventional aluminum heat sink is shown, which generally includes a backing plate 51, a plurality of fins 52 formed on the backing plate 51. The backing plate 51 is of a square shape, with one side to be directly attached to an electronic device for absorbing the heat generated by the electronic device, and with the other side from which the fins 52 extend with a length for rapid transferring the heat absorbed by the base 51 to the cooling medium.

Apart from metallic materials, a heat sink may also be made of ceramics. A ceramic heat sink may perform well and has numerous advantages over conventional design and materials; however, it remains difficult to make and shape in a desired manner. That is, the shape of the ceramic heat sink is limited in technical and other aspects. Until now, a ceramic heat sink may be formed with tiny dotted bumps, as depicted in FIG. 6, or with wavy ribs having triangular cross sections, as depicted in FIG. 7. These two ceramic heat sinks share one thing in common. That is, both the bumps and the ribs are short in height. It can therefore hardly maximize their surface areas for further improvement of the heat dissipation properties.

One of a desired-shaped ceramic heat sink is illustrated in U.S. Patent Pub. No. 2012/0255719 (2012), reproduced in FIG. 8. In this heat sink, the fins are of great height in comparison to the backing plate, and the heat sink seems to be a perfect craft for high-efficiency heat dissipation. However, in reality, the heat sink product can hardly be made or found in the market. The materials of the product tend to stick to the mold while demolding, causing the final product be damaged and disqualified.

SUMMARY OF THE INVENTION

Accordingly, it is an object of the present invention to provide a ceramic heat sink and method of making to satisfy the aforementioned need.

Briefly described, the ceramic heat sink of this invention includes a sintered ceramic body produced by sintering a composite powder mixture which includes nitride-based ceramic powder and titanium powder. The nitride-base ceramic powder includes a first nitride powder material with a relatively higher heat-absorption capacity, and a second nitride powder material with a relatively higher heat-dissipation capacity.

The method of making the ceramic heat sink includes the following steps: Firstly, a mixed material of nitrite-based ceramic powder, titanium powder and inorganic resin is prepared. The mixed material is then shaped with a mold coated with titanium to faun a ceramic blank. Finally, the ceramic blank is sintered to form the ceramic heat sink.

Preferably, the mold includes a male mold half and a female mold half, and each of the male and female mold halves has its inner wall coated with titanium. And, the female mold half is heated and kept at a temperature of about 60 to 70 degrees Celsius while the male mold half is not actively heated.

The foregoing and other objectives, features, and advantages of the invention will be more readily understood upon consideration of the following detailed description of the invention, taken in conjunction with the accompanying drawings.

DETAILED DESCRIPTION OF EMBODIMENTS

Figure 1:
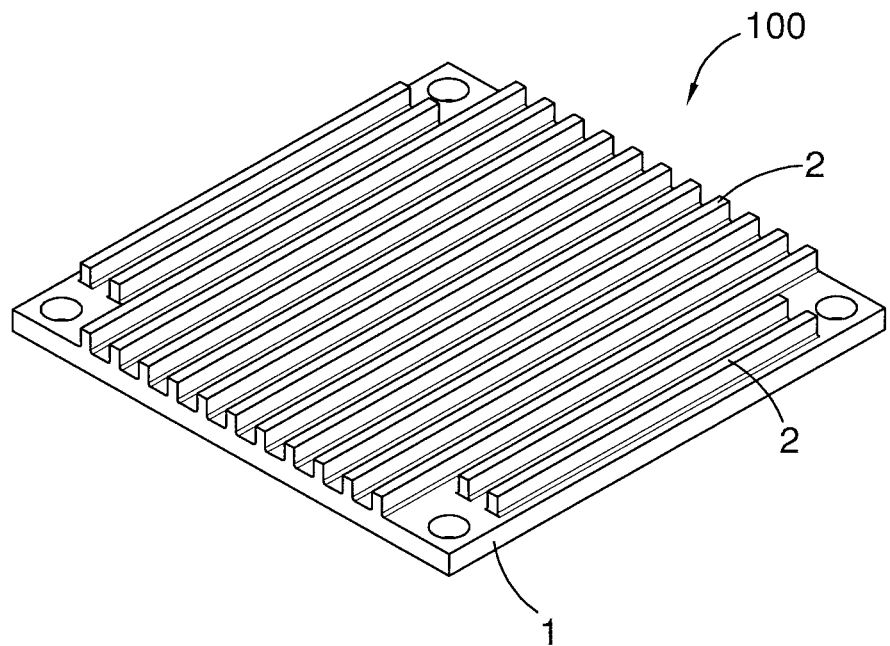
FIG. 1 is a perspective view of a ceramic heat sink in accordance with the preferred embodiment of the present invention.
Figure 2:
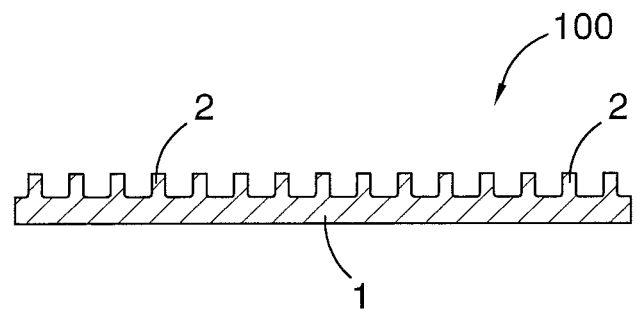
FIG. 2 is a cross section of the ceramic heat sink shown in FIG. 1.
Figure 7:
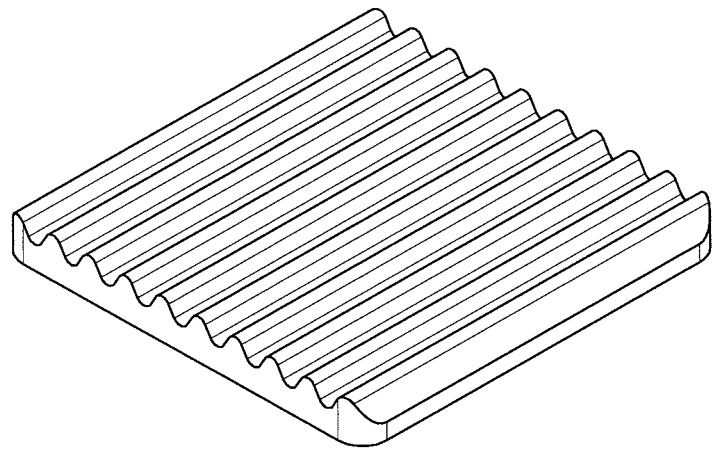
FIG. 7 is a conventional ceramic heat sink with wavy ribs.
Figure 8:
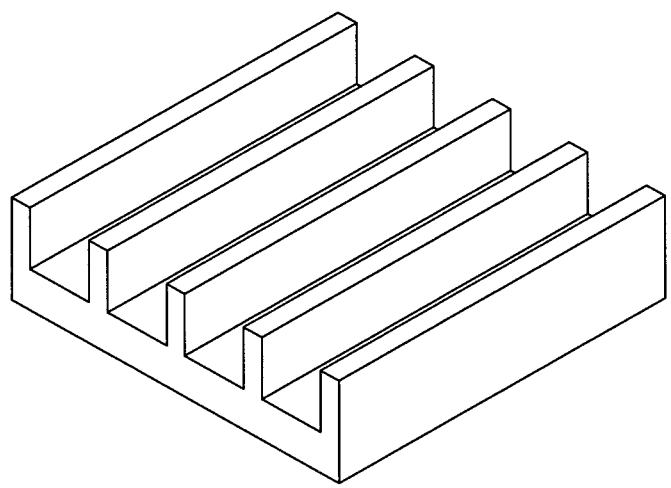
FIG. 8 is an abstract or idea of a ceramic heat sink.

Referring to FIGS. 1 and 2, there is shown a preferred embodiment of the ceramic heat sink 100 which includes a sintered ceramic body produced by sintering a composite powder mixture. The sintered ceramic body includes a backing plate 1 and ribs 2. Each rib 2 has a square or rectangular cross section. In particular, the ribs 2 have a height slightly higher than that of conventional wavy ribs shown in FIG. 7.

The composite powder mixture includes nitride-based ceramic powder and titanium powder. In this embodiment, the nitride-base ceramic powder includes a first nitride powder material (such as silicon nitride) with a relatively higher heat-absorption capacity, and a second nitride powder material (such as boron nitride) with a relatively higher heat-dissipation capacity. As such, the ceramic heat sink can easily absorb the heat generated by a heat source (electronic device) via the first nitride powder material, and then dissipate the absorbed heat via the second nitride powder material. It should be noted that the titanium powder herewith further acts as a heat transfer medium between the first and second nitride powder materials such that the heat absorbed by the first nitride powder material can be efficiently transferred to the second nitride power material. Preferably, in the composite powder mixture, the titanium powder has a weight percentage greater than that of the second nitride powder material, and the second nitride powder material has its weight percentage greater than that of the first nitride powder material. In this preferred embodiment, the weight percentages of the titanium powder, the boron nitride powder, and the silicon nitride powder are of about 45%, 30% and 20% respectively in the composite powder mixture. Preferably, each of the first nitride powder, the second nitride powder and the titanium powder has a particle size in the range of micro to nano-meters scale for heat transfer enhancement.

Figure 3:
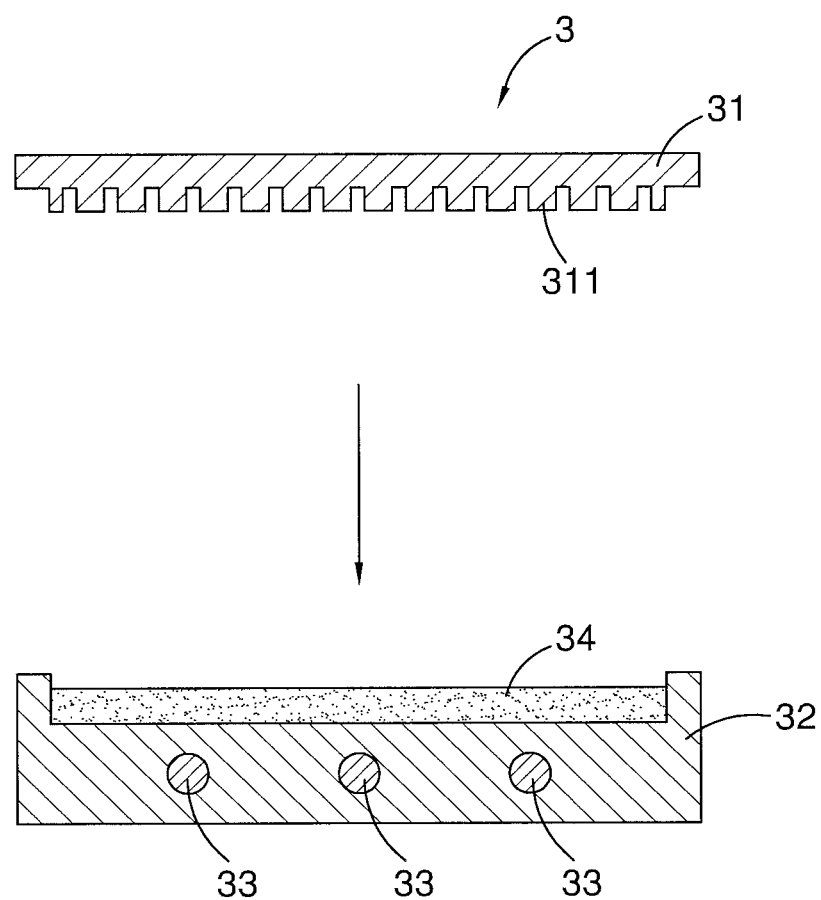
FIG. 3 is a cross section of a mold for making the ceramic heat sink.
Figure 4:
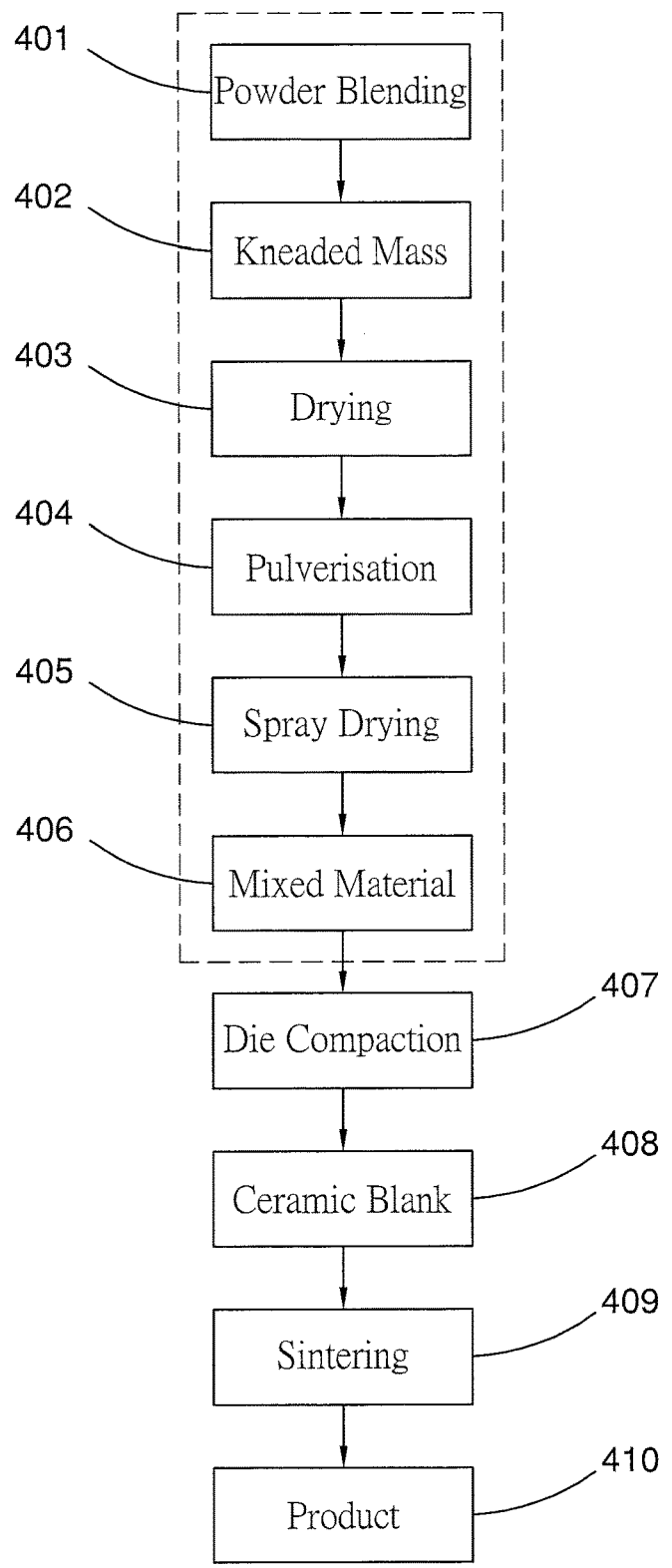
FIG. 4 illustrates, in flowchart form, one embodiment of a process for making the ceramic heat sink.
Figure 5:
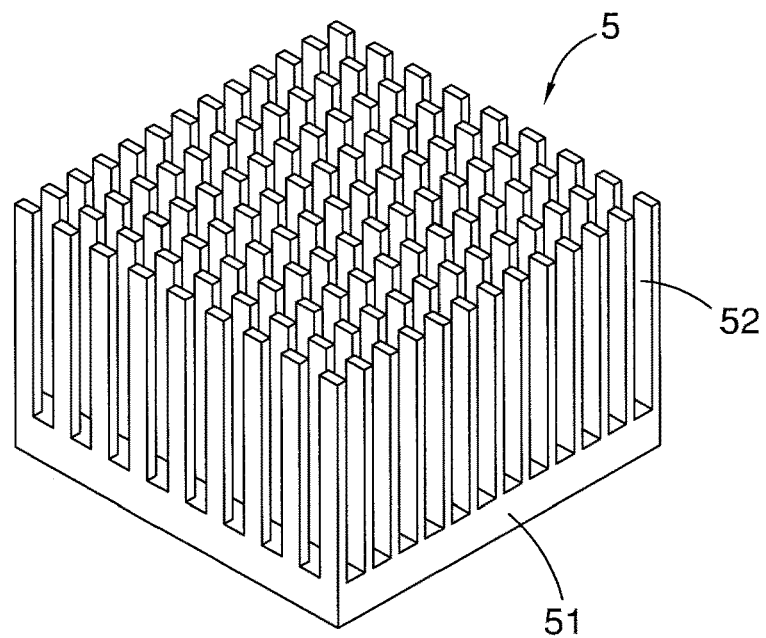
FIG. 5 is a conventional aluminum heat sink.
Figure 6:
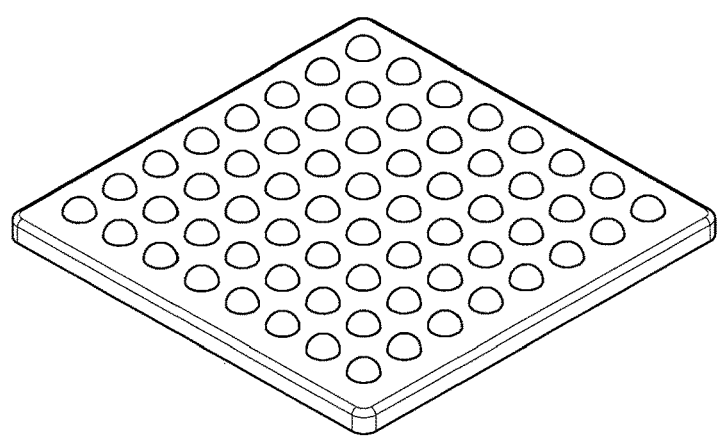
FIG. 6 is a conventional ceramic heat sink with dotted bumps.

FIG. 3 illustrates a mold 3 for making the ceramic heat sink 100. The mold 3 generally includes an upper, male mold half 31 and a lower, female mold half 32. Each of the male and female mold halves 31, 32 has its inner wall surfaces coated with titanium. Additionally, the female mold half 32 can be heated by heaters 33. FIG. 4 illustrates a method for making the ceramic heat sink 100 with the mold 3, and generally includes the steps of material preparation 401-406, molding 407, and sintering 409.

Firstly, in step 401, nitrite ceramic powder, titanium powder and inorganic resin are blended to form a kneaded mass 402. As mentioned earlier, the nitride-base ceramic powder includes a first nitride powder material (such as silicon nitride) with a relatively higher heat-absorption capacity, and a second nitride powder material (such as boron nitride) with a relatively higher heat-dissipation capacity. The inorganic resin serves as a binder to integrate the nitrite ceramic powder and the titanium powder in a desired fashion. After the kneaded mass 402 is formed, it is dried (step 401) and grounded (step 404) into a mixed powder. Thereafter, the mixed powder is rapidly dried (step 405) with a hot gas by a spray dryer to formed a mixed material 406 in the form of fine particles ready to be introduced into the mold 3. In this way, the mixed material 406 can have high flowability to be rapid introduced into the mold 3 under automatic control because each particle of this mixed material 406 is shaped like a sphere when viewed on a microscopic level.

Once the mixed material 406 is fully prepared, the mixed material 406 is then introduced into the mold 3 of the desired shape and pressed to form a ceramic blank 408. Since the mixed material 406 contains a material of titanium and the mold 3 is also coated with titanium, the molded ceramic blank 408 can be easily released from the mold 3 in its integrity without a sticking problem appeared in prior art. Preferably, during the compaction process, the male mold half 31 of the mold 3 is not actively heated in order to avoid increasing a bonding strength between the ceramic blank 408 and the mold 3 and causing any sticking problem for demolding. On the contrary, the female mold half 32 of the mold 3 has little demolding problem since the inner wall surfaces of the female mold half 32 are generally planar with less surface area, unlike the toothed or bumpy surface of the male mold half 31. Thus, the female mold half 32 is preferably actively heated for fostering a bonding of the mixed material 406 within the mold 3, before sintering 409. The female mold half 32 is preferably kept at a temperature of about 60 to 70 degrees Celsius.

Once the ceramic blank 408 is formed and removed from the mold 3, the blank 408 is further sintered (step 409) to finally form a solid, ceramic heat sink product 410 (the sintered ceramic body). It is noted that during the sintering, the inorganic resin will burn out and disappear at the end.

With its unique composition and structure, the ceramic heat sink of the present invention has superior heat dissipation properties. Moreover, the ceramic heat sink can be made and shaped in its integrity because the mold is peculiarly coated with fine titanium particles which can smooth the surface texture of the mold and therefore enable easy demolding of the ceramic blank. Accordingly, the ceramic heat sink can be produced in high yield and in a cost-effective manner.

It should be evident that this disclosure is by way of example and that various changes may be made by adding, modifying or eliminating details without departing from the fair scope of the teaching contained in this disclosure.

What is claimed is:

1. A ceramic heat sink, comprising a sintered ceramic body produced by sintering a composite powder mixture including nitride-based ceramic powder and titanium powder, wherein the nitride-base ceramic powder includes a first nitride powder material with a relatively higher heat-absorption capacity, and a second nitride powder material with a relatively higher heat-dissipation capacity.

2. A ceramic heat sink as recited in claim 1, wherein in the composite powder mixture, the titanium powder has a weight percentage greater than that of the second nitride powder material, and the second nitride powder material has its weight percentage greater than that of the first nitride powder material.

3. A ceramic heat sink as recited in claim 2, wherein the first nitride powder includes silicon nitride, and the second nitride powder includes boron nitride.

4. A method of making a ceramic heat sink, comprising the following steps:
  (a). preparing a mixed material of nitrite-based ceramic powder, titanium powder and inorganic resin;
  (b). molding the mixed material with a mold coated with titanium into a ceramic blank; and
  (c). sintering the ceramic blank to form the ceramic heat sink;
  wherein in step (a), the nitride-based ceramic powder includes a first nitride powder material with a relatively higher heat-absorption capacity, and a second nitride powder material with a relatively higher heat-dissipation capacity.

5. A method of making a ceramic heat sink as recited in claim 4, wherein the first nitride powder includes silicon nitride, and the second nitride powder includes boron nitride.

6. A method of making a ceramic heat sink as recited in claim 4, wherein in step (a), each of the first nitride powder, the second nitride powder and the titanium powder have a particle size in the range of micro to nano-meters scale.

7. A method of making a ceramic heat sink as recited in claim 4, wherein the step (a) includes the steps of:
  (a1). blending the nitrite ceramic powder, the titanium powder and the inorganic resin to form a kneaded mass;
  (a2). drying the kneaded mass;
  (a3). milling the dried kneaded mass into a mixed powder; and
  (a4). spray-drying the mixed powder to form the mixed material in the form of fine particles ready to be introduced to the mold.

8. A method of making a ceramic heat sink as recited in claim 4, wherein in step (b), the mold includes a male mold half and a female mold half, and each of the male and female mold halves has its inner wall coated with titanium.

9. A method of making a ceramic heat sink as recited in claim 8, wherein in step (b), the female mold half is heated and kept at a temperature of about 60 to 70 degrees Celsius while the male mold half is not actively heated.

* * * * *